(12) United States Patent
Nelson

(10) Patent No.: US 8,088,998 B2
(45) Date of Patent: Jan. 3, 2012

(54) SECTIONAL ELECTRICAL BOXES

(76) Inventor: James M. Nelson, Helena, MT (US)

( * ) Notice: Subject to any disclaimer, the term of this patent is extended or adjusted under 35 U.S.C. 154(b) by 672 days.

(21) Appl. No.: 12/185,348

(22) Filed: Aug. 4, 2008

(65) Prior Publication Data

US 2010/0025064 A1    Feb. 4, 2010

(51) Int. Cl.
*H05K 5/00* (2006.01)
(52) U.S. Cl. ............. 174/50; 174/58; 439/535; 248/906
(58) Field of Classification Search ............... 174/50, 174/58, 63; 220/4.02; 439/335; 248/906; 33/528
See application file for complete search history.

(56) References Cited

U.S. PATENT DOCUMENTS

| | | | |
|---|---|---|---|
| 2,320,400 A | 6/1943 | Bedell |
| 2,357,787 A | 6/1944 | Windsheimer |
| 2,757,817 A | 8/1956 | Egan |
| 3,863,021 A | 1/1975 | Schindler et al. |
| 3,895,732 A | 7/1975 | Robinson et al. |
| 4,244,483 A | 1/1981 | Bauer et al. |
| 4,304,958 A | 12/1981 | Neff et al. |
| 4,306,109 A | 12/1981 | Nattel |
| 4,428,492 A | 1/1984 | Jorgensen |
| 4,591,658 A | 5/1986 | Bauer et al. |
| 4,605,816 A | 8/1986 | Jorgensen et al. |
| 4,612,412 A | 9/1986 | Johnston |
| 4,874,905 A | 10/1989 | Schnell et al. |
| 5,289,934 A | 3/1994 | Smith et al. |
| 5,594,208 A | 1/1997 | Cancellieri et al. |
| 6,278,058 B1 | 8/2001 | Anderson |
| 6,335,486 B1 | 1/2002 | Reiker |
| 6,353,181 B1 | 3/2002 | Jarry et al. |
| 6,365,831 B1 | 4/2002 | Rupp et al. |
| 6,563,046 B1 | 5/2003 | Jarry et al. |
| 6,604,798 B1 | 8/2003 | Cooney |
| 6,710,247 B2 | 3/2004 | Nojima |
| 6,903,272 B2 | 6/2005 | Dinh |
| 6,956,172 B2 | 10/2005 | Dinh |
| 6,976,601 B2 | 12/2005 | Adam |
| 7,009,108 B2 | 3/2006 | Vargas et al. |
| 7,087,837 B1 | 8/2006 | Gretz |
| 7,098,399 B1 | 8/2006 | Gretz et al. |
| 7,117,591 B1 | 10/2006 | Gretz |
| 7,170,015 B1 | 1/2007 | Roesch et al. |
| 7,179,993 B2 | 2/2007 | Rose |
| 7,179,994 B2 | 2/2007 | Elberson |
| 7,193,159 B2 | 3/2007 | Makwinski et al. |
| 7,214,876 B1 | 5/2007 | Haberek et al. |
| 7,279,635 B2 | 10/2007 | Hyde |
| 2007/0007286 A1 | 1/2007 | Seib et al. |
| 2007/0163798 A1 | 7/2007 | Wenzler |

FOREIGN PATENT DOCUMENTS

| | | |
|---|---|---|
| DE | 10232102 | 2/2004 |
| EP | 1458074 | 9/2004 |
| EP | 1648066 | 8/2007 |
| FR | 2790356 | 10/2000 |
| WO | WO/99/48181 | 9/1999 |
| WO | WO/2007/026849 | 8/2007 |

*Primary Examiner* — Dhirubhai R Patel

(57) ABSTRACT

Flush mount and surface mount sectional electrical box assemblies is provided. In the flush mount electrical box, the male section has a clamping member and a mounting bracket guide. The female section has a clamp guide, a mounting bracket, and a ramp. In the surface mount sectional electrical box assembly the base section fits inside the front section. Wire molding joining the surface mount box with a molding base having an integrally molded combination raceway and a molding cover. A further embodiment provided is a complete electrical box assembly with the clamp members biasing toward the ramps.

9 Claims, 19 Drawing Sheets

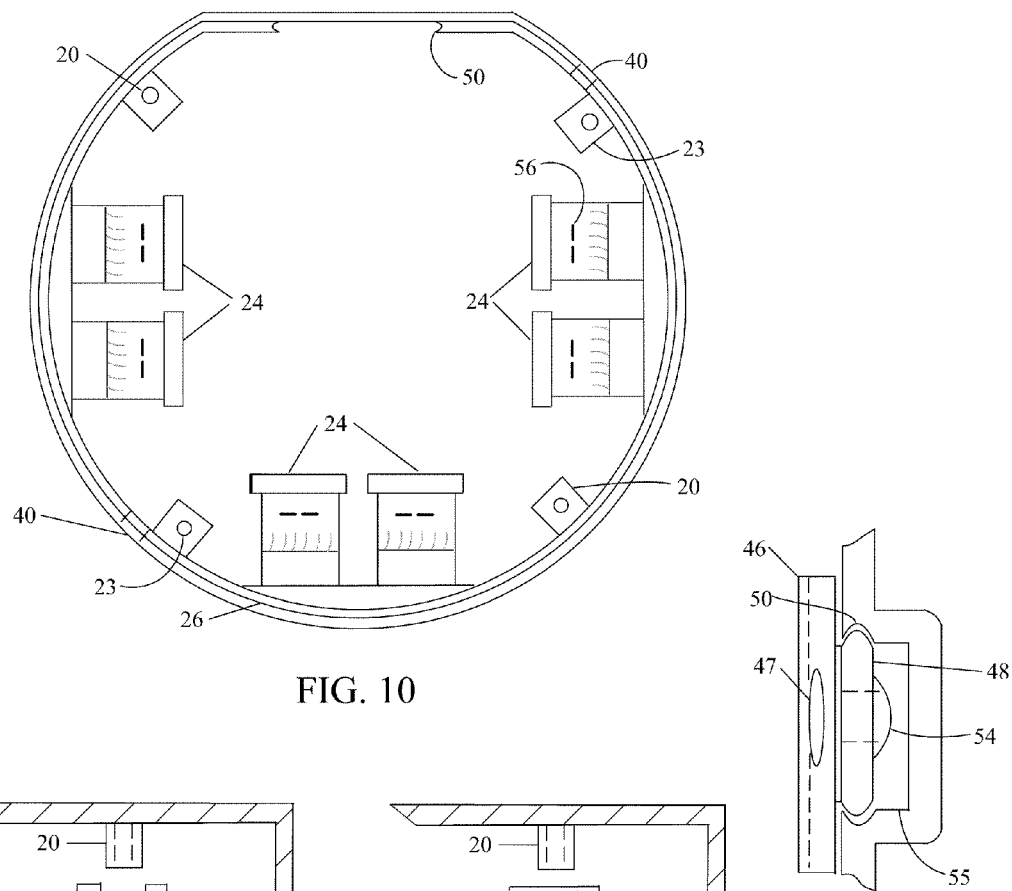

SECTIONAL ELECTRICAL BOXES

BACKGROUND

The present invention relates to flush mount and surface mount sectional electrical box assemblies having cable clamping members on the male section. The assembled electrical box sections securely held together with snap tabs and yoke screws. A further objective is a one-piece electrical box with clamping members biasing toward a ramp.

In prior art electrical boxes, the design for clamping the wiring has been cumbersome. The clamp has been mechanically fastened to secure the wire. The cable clamp has been integrally hinged to the wall portion either in a single door or a bifold door arrangement. Sliding clip type clamps appear functional other than the possibility of lost clamps somewhere between the factory and field installation. Wire clamps integrally hinged to the wall portion, pose the difficulty of feeding the wire through the cable port and also the difficulty removing the wire from the cable port. During the struggle of pushing or pulling, the likelihood of the cable clamp breaking at the hinge occurs. The present invention's embodiments address the ease of feeding wire into the electrical box, and to dissemble the electrical box to add or remove wires. When the wire is pulled, the cable clamp biases toward a cable grip ramp increasing the pull grip. The cable clamps are an integral part of the male and front sections, thus less likely to become missing.

SUMMARY

In accordance with the present invention, the flush mount and surface mount sectional electrical box assemblies accommodate many electrical wiring situations. The interconnecting sections are held together with snap tabs and further secured by a fastened yoke boss and yoke post. In the gangable versions, gang snaps, sway clips, gang channel, gang bosses along with the yoke bosses and yoke posts hold the sections together. The male sections have clamping members that slide into the female section. When the clamping member aligns with the yoke post, the clamping arm is cutout so the yoke boss can engage the yoke post. When the male section is extended in depth, the yoke post needs to be extended. Mounting brackets, anchor flanges, flags, and a stud clamp are various ways the electrical box assemblies can be attached to a support structure. With the ceiling fan electrical box assembly, a cavity on the female section receives the support structure. On the surface mounted box, the base section can fit inside the front section to complete the assembly. With surface mount electrical box assemblies adjoining wire molding with a base, a cover, wire hanger inserts, and a molding base with combination raceway can be used. The low voltage sections have a harness, and open cable ports. A further objective is a one-piece electrical box with the ramp in front of the cable clamp for ease in feeding conductor thru a cable port.

BRIEF DESCRIPTION OF THE DRAWINGS

FIG. 10 is a top plan view taken along line 10-10 of FIG. 8.

FIG. 11 is a cross sectional detail view of a clamp arm cutout.

FIG. 11A is a cross sectional detail view of a yoke post raceway.

FIG. 11B is a sectional detail view of a mounting bracket guide.

Figure 1:
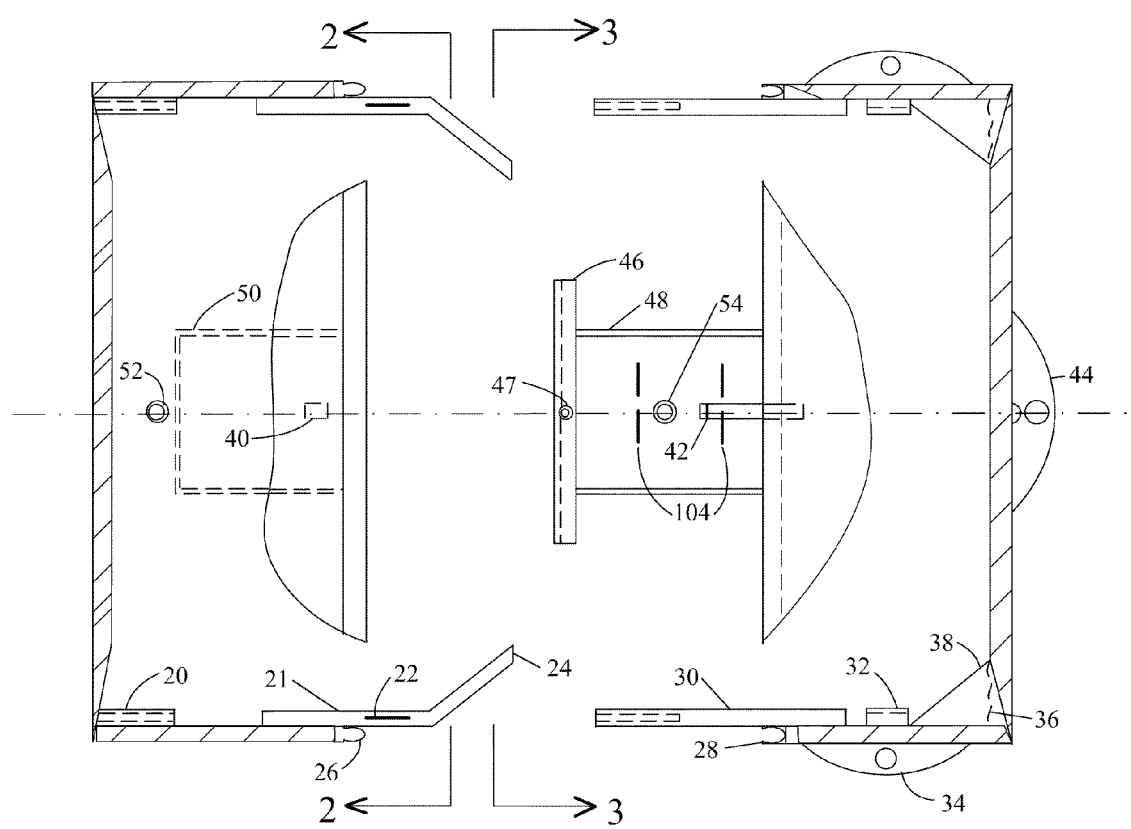
FIG. 1 is a side elevation cross sectional adjacent view of a flush mount electrical box.

| REFERENCE NUMERALS | |
|---|---|
| 20 | yoke boss |
| 21 | clamp arm |
| 22 | arm tongue |
| 23 | load yoke boss |
| 24 | cable clamp |
| 25 | load yoke post |
| 26 | male interlock |

-continued

| REFERENCE NUMERALS | |
|---|---|
| 27 | yoke post raceway |
| 28 | female interlock |
| 29 | piggyback knockout |
| 30 | yoke post |
| 31 | cover plate anchor |
| 32 | clamp guide |
| 33 | wall clamp |
| 34 | anchor flange |
| 35 | cover plate flange |
| 36 | ramp |
| 37 | stress bead |
| 38 | retaining wall |
| 40 | snap recess |
| 42 | snap tab |
| 43 | round box anchor flange |
| 44 | gusset anchor flange |
| 46 | stud guide |
| 47 | stud guide hole |
| 48 | mounting bracket |
| 50 | mounting bracket guide |
| 52 | stud angle hole |
| 54 | countersunk hole |
| 55 | screw-head cavity |
| 56 | screw driver pry slot |
| 58 | grounding terminal |
| 59 | rectangular conduit knock-out |
| 60 | conduit knock-out |
| 62 | cable port |
| 63 | click ribs |
| 64 | yoke post cutout |
| 65 | knock-out hole |
| 66 | surface box side wall cable clamp |
| 67 | combination wire hanger |
| 68 | molding tab |
| 69 | molding cover leg |
| 70 | wire hanger insert |
| 71 | hanger anchor hole |
| 72 | molding tab slot |
| 73 | molding base female interlock |
| 74 | snap tab cutout |
| 75 | molding base |
| 76 | molding cover |
| 77 | molding cover stiffener |
| 78 | cable hanger |
| 80 | ceiling yoke boss |
| 82 | ceiling yoke post |
| 84 | washer hole |
| 86 | stud/ceiling joist cavity |
| 88 | gusset anchor flange |
| 90 | low voltage port |
| 92 | gang boss |
| 94 | gang channel |
| 96 | back wall gang snap |
| 97 | LV threaded yoke boss |
| 98 | gang recess |
| 100 | LV wire harness |
| 102 | side LV port |
| 104 | gauge ribs |
| 108 | gang box gusset anchor flange |
| 110 | extended box yoke post |
| 114 | sway clip on gangable boxes |
| 116 | sway notch |
| 118 | LV partition insert ribs |

DETAILED DESCRIPTION OF THE INVENTION

Figure 1A:
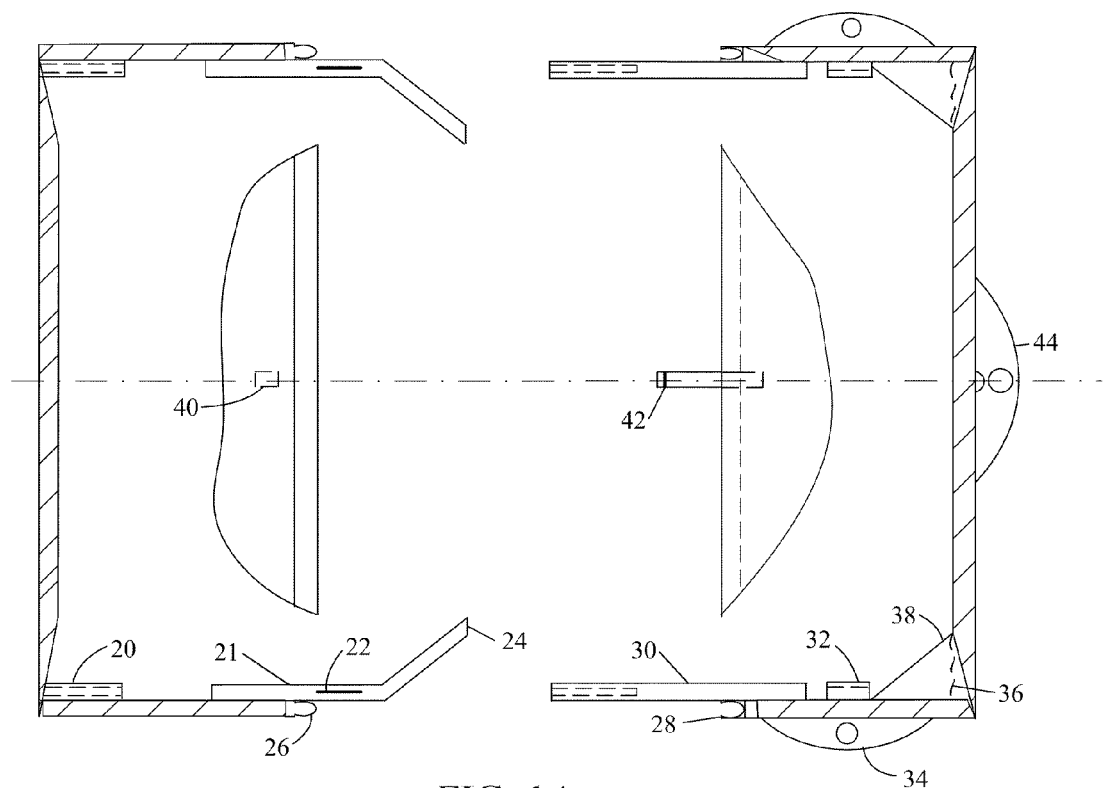
FIG. 1A is a side elevation cross sectional adjacent view of a flush mount electrical box without a box mounting bracket and a mounting bracket guide.
Figure 2:
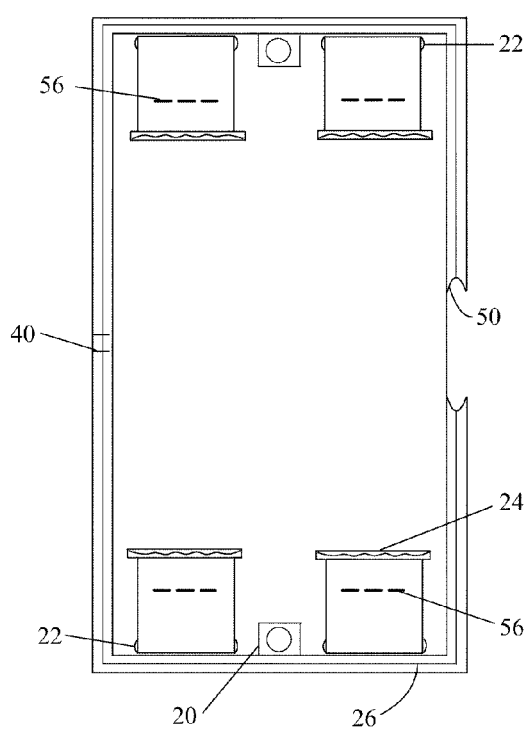
FIG. 2 is a front elevation view taken along line 2-2 of FIG. 1.
Figure 3:
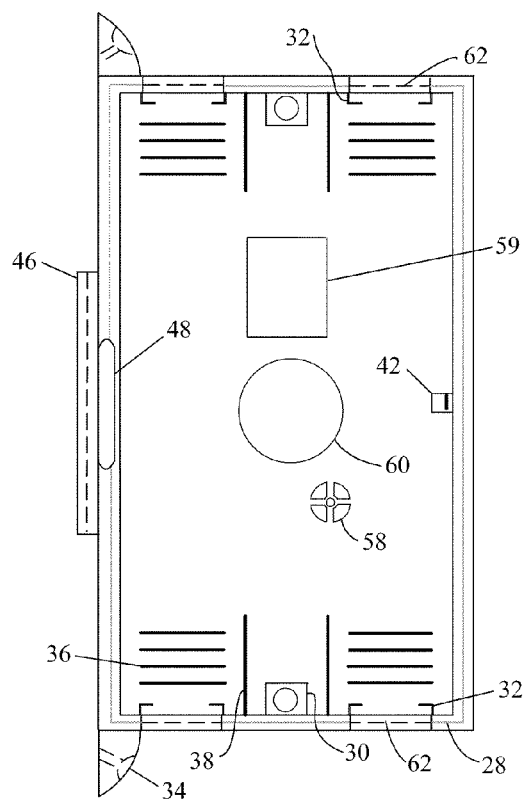
FIG. 3 is a front elevation view taken along line 3-3 of FIG. 1.

In accordance with the invention, the illustrative embodiments relate to flush mounted, surface mounted high and low voltage sectional electrical box assemblies. Further embodiments relate to one-piece electrical box assemblies. The assemblies can be made of metal. The assemblies can be made of non-metallic fire resistant resin. The male sections have integral a clamp arm 21 with a cable clamp 24, and a yoke boss 20. Whereas the female sections have a cable ports 62 perpendicular to a ramp 36, a clamp guide 32, a retaining wall 38, and a yoke post 30. The female section periphery interior enclosure walls can be thicker for greater wire pull-hold. A yoke is the portion of an electrical device such as an outlet or switch that is fastened to the electrical box. Beginning with FIG. 1, the main difference between a flush mounted box assemblies and a surface mounted assemblies is a mounting bracket 48 and anchor flanges 34, 43, 44, 88, 108 on the flush mounted box assemblies. The mounting bracket 48 slides into a mounting bracket guide 50 on the male section. The bracket 48 in some instances having a stud guide 46. A stud anchor hole 52 and a countersunk hole 54 on the bracket 48 further secure the box sections to a support structure. A gauge ribs 104 position the electrical box in relation to the structure thickness. Another purpose of the mounting bracket 48 is to align the clamp arm 21 into the clamp guide 32. When the male periphery portions of the electrical box with a male interlock 26 connects with the female periphery portion of a female interlock 28, the electrical box sections form an assembly. As the male section of the box slides on the mounting bracket 48, the cable arm 21 with a arm tongue 22, fits into a clamp guide 32 on the female section preventing the cable clamp 24 from buckling when electrical wiring is pushed against the ramp 36. In the absence of arm tongue 22, a clamp arm 21 can slide into clamp guide 32 when the cable clamp 24 is notched where the cable clamp 24 joins the clamp arm 21 (not shown). Also when trying to pull a conductor out of the box, the cable clamp 24 tends to move toward the ramp 36. Conductor capacity can be determined by the position of the cable guide 32. A retaining wall 38 on one or both sides of a cable port 62 positions the electrical wiring. An enclosure wall can substitute as the retaining wall 38. When there are no cable clamps 24 on the male section, cable port knock-outs would be required at cable port 62. A snap tab 42 fits into a snap recess 40 to hold or release the electrical box sections, the snap recess 40 can be elongated to allow slack. When an electrical device or mounting plate is anchored to the electrical box with yoke screws, a yoke post 30 and a yoke boss 20 further secure the electrical box sections. The yoke post 30 and 110 can extend to the back wall for structural integrity. When the cable clamp 24 face and elongate cable ports 62 are wider, the retaining wall 38 can be integrally connected to the yoke post 30 or 110 (not shown). FIG. 2 is the rear view of the male box section of FIG. 1 and FIG. 3 is the front view of the female box section of FIG. 1. FIG. 2 folds onto FIG. 3 to form an assembly. A screw driver pry slot 56, a grounding terminal 58, and a conduit knock-out 60 are generic features. In FIG. 1A, a version of the flush mount assembly of FIG. 1 without the mounting bracket 48 and the mounting bracket guide 50 is shown. In FIG. 1A, an additional snap tab 42 and snap recess 40 is needed. Also, the snap tab 42 and the snap recess 40 can be located on the top and bottom enclosure walls.

Figure 4:
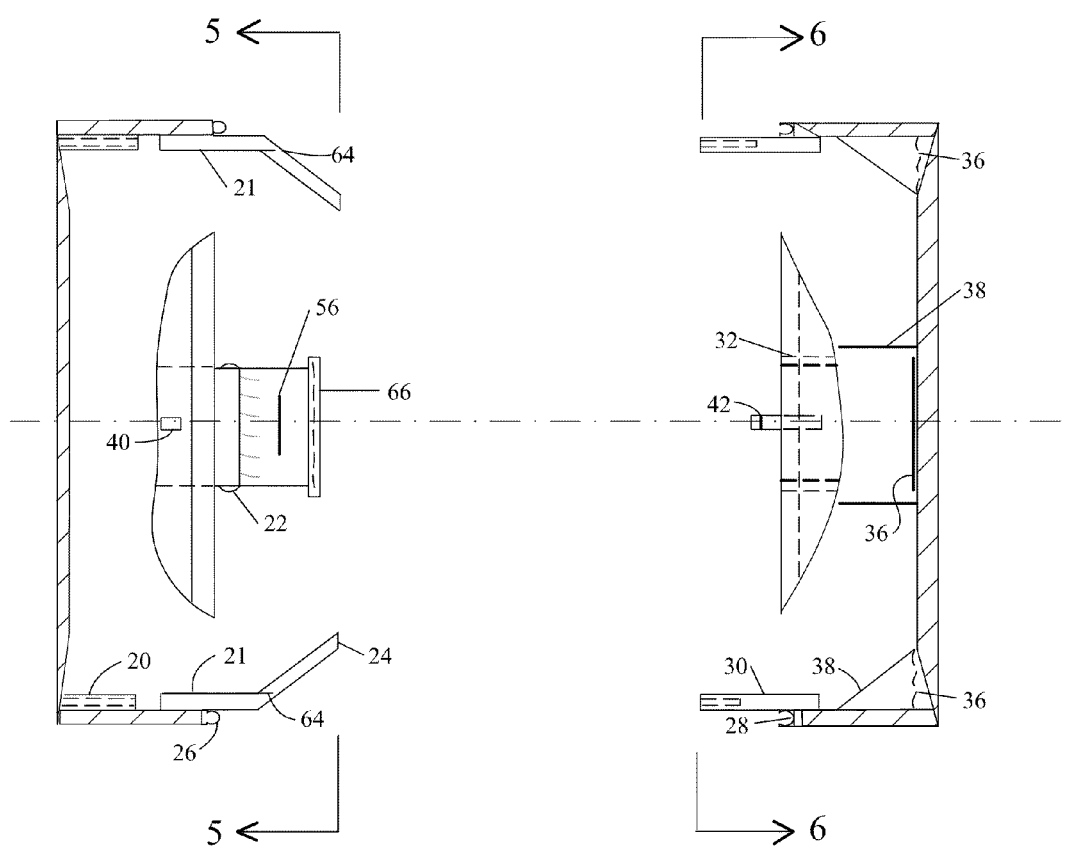
FIG. 4 is a side elevation cross sectional adjacent view of a surface mount electrical box.
Figure 5:
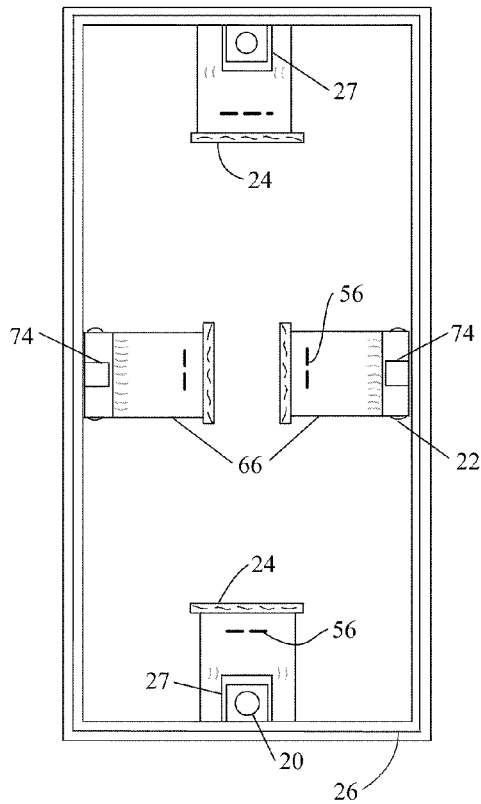
FIG. 5 is a front elevation view taken along line 5-5 of FIG. 4.
Figure 6:
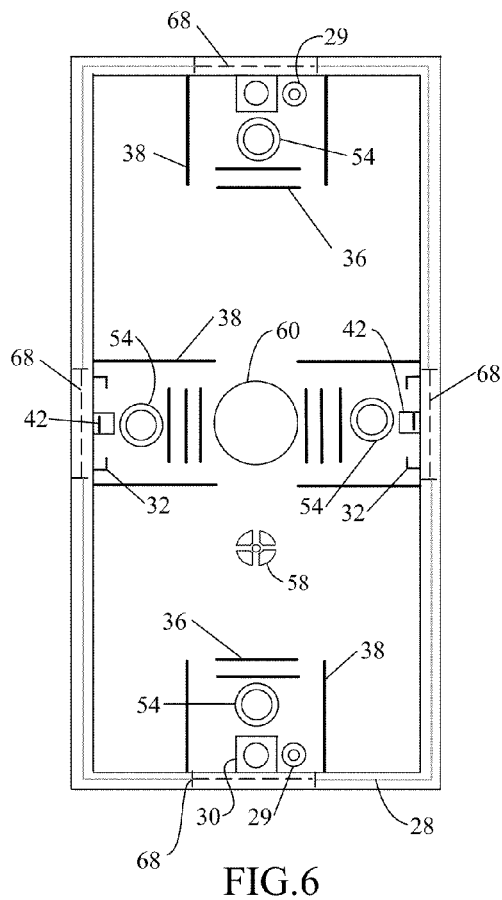
FIG. 6 is a front elevation view taken along line 6-6 of FIG. 4.
Figure 7:
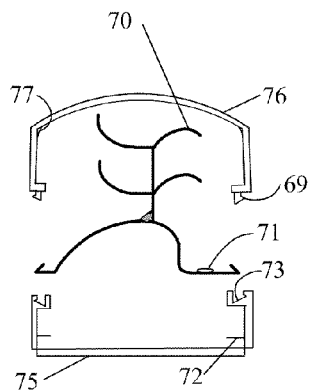
FIG. 7 is a profile view of wire molding extrusion with wire hanger insert and molding cover.
Figure 7A:
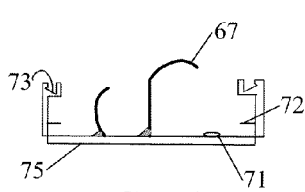
FIG. 7A is a profile view of a wire molding base with integral combination raceway.
Figure 7B:
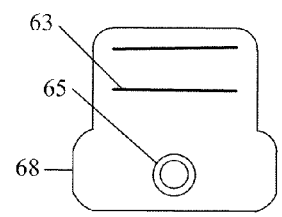
FIG. 7B is a plan view of a wire molding base tab insert.
Figure 7C:
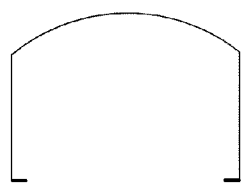
FIG. 7C is a plan view of a wire molding butt connector.
Figure 7D:
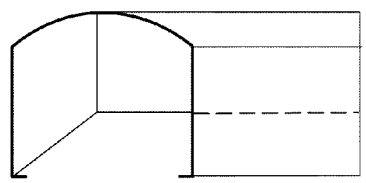
FIG. 7D is a profile view of a wire molding L angle connector.
Figure 7E:
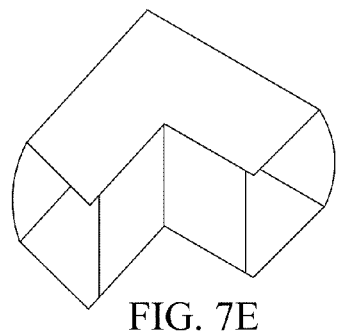
FIG. 7E is a profile view of a wire molding elbow connector

Moving onto, a surface mounted electrical box assembly of FIG. 4, a yoke post cutout 64 is shown in better detail in FIG. 11. On the surface mount electrical box, FIG. 5 is the rear view of the male box section of FIG. 4 and FIG. 6 is the front view of the female box section of FIG. 4. FIG. 5 folds onto FIG. 6 to form an assembly. In FIG. 5, a side wall cables clamp 66 with a snap tab cutout 74, a cover plate flange 35, and the arm tongue 22 is shown. The snap recess 40 can be filled in and a snap catch (not shown) used. In FIG. 6, there is a mold knock-out mold tab 68 shown in better detail in FIG. 7B with a knock-out hole 65. A piggyback knock-out 29 is use to mount the surface mount box to a flush mount box. In which case the width of the surface box would have to be increased, with a periphery flange on the face of the surface-mounted box to receive a standard cover plate. Another option is to attach a mounting plate to the flush box then attach the surface box to the mounting plate. In FIG. 7, a molding cover 76 with a molding cover leg 69 are slightly angled outwards with a continuous molding covering stiffener 77 snaps into a molding female interlock 73 of a molding base 75 such that if the curved portion of the mold cover 76 is bumped then less likely to disengage. A wire hanger insert 70 can be spaced apart to hang conductor in the molding base 75 with a hanger anchor hole 71 securing the wire hanger 70 and the molding base 75 to a support structure. When conductor runs vertically in the molding base 75, the conductor should be wrapped with electrical tape at the anchored wire hanger insert 70. When a wire hanger 67 is continuously extruded on the molding base 75, a combination raceway results as seen in FIG. 7A. The upper trough portions of the hanger 67 have holes for cable ties. The molding base 75 has a molding tab slot 72 that receives the molding tab 68 (see FIG. 7B). The molding tab 68 covers the fastener in the knock-out hole 65 of the base sectional box. The molding tab 68 slides into the mold tab slot 72 of the molding base 75. A clip rib 63 overlaps the ribs of the ramp 36. A tab knock-out hole 65 allows a fastener to be anchored to the support structure. FIGS. 7C-7E show wire molding connectors for a finished appearance.

Figure 8:
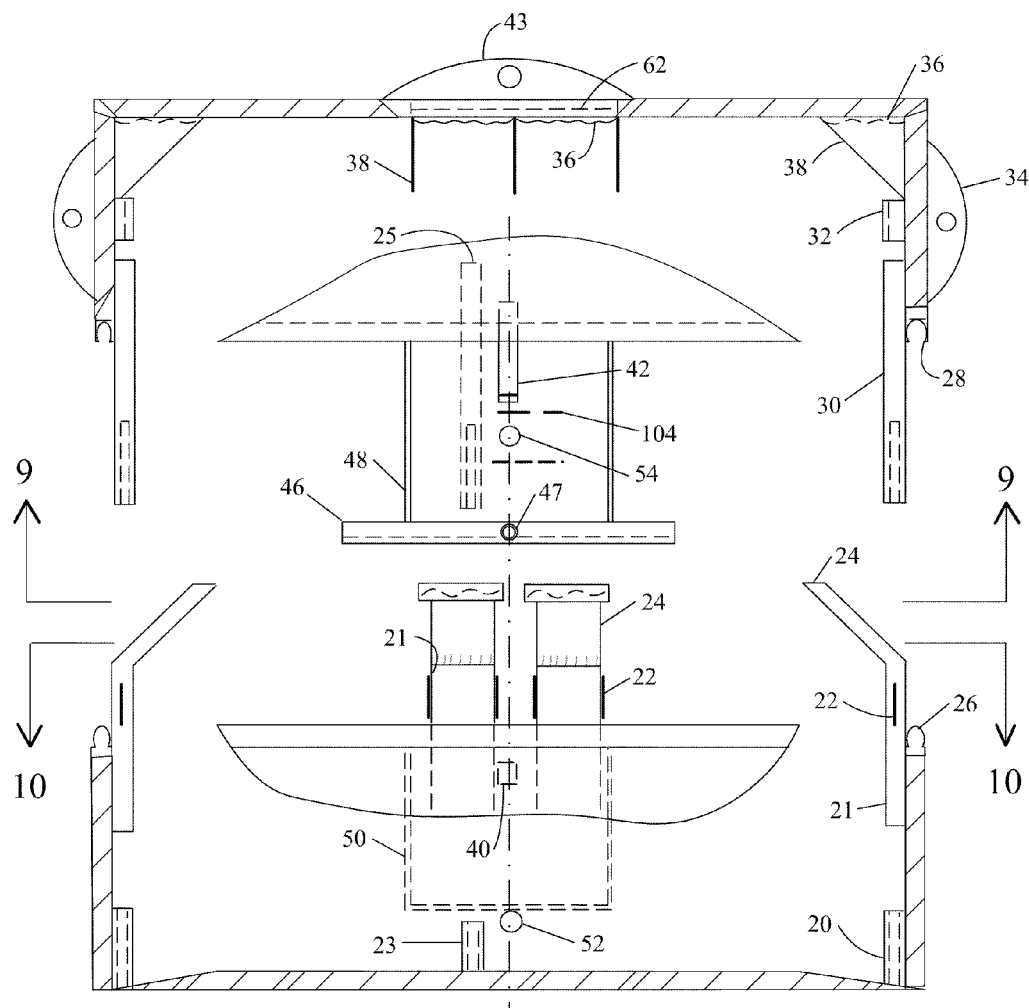
FIG. 8 is a side elevation cross sectional adjacent view of a round flush mount electrical box.
Figure 9:
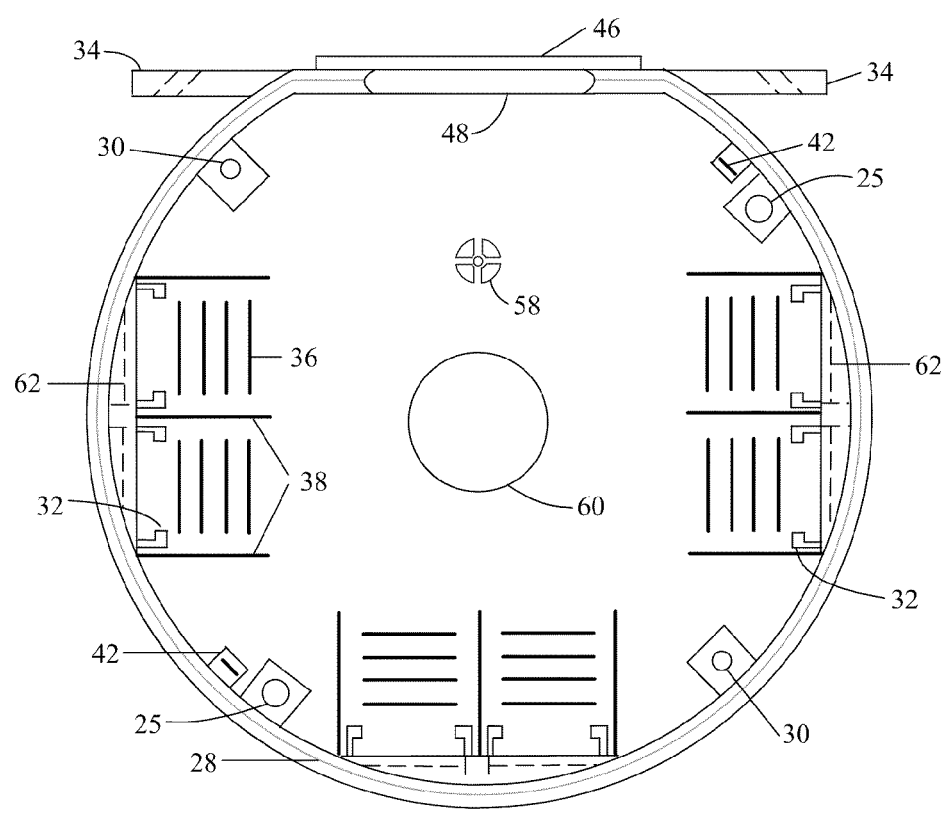
FIG. 9 is a top plan view taken along line 9-9 of FIG. 8.

Referring now to FIGS. 8, 9, and 10 the round flush mount electrical boxes show many of the same details of FIGS. 1,2, and 3. The round flush mount boxes have the cable port 62, additional cable clamps 24, and a round box anchor flange 43. A load yoke post 25 and a load yoke boss 23 further secure the assembly. In FIG. 11, the clamp arm 21 has a yoke post cut out 64 (see FIGS. 4 and 5) so the yoke post 30 can slide past the clamp arm 21. The yoke post cut out 64 is necessary when the yoke post 25, 30 or 110 lines-up with the clamp arm 21. In FIG. 11A, the yoke post raceway 27 cavity allows the yoke post 25, 30, or 110 to engage the yoke boss 20 when lining-up with the cable arm 21 In the mounting bracket guide 50 of FIG. 11B, a screw-head cavity 55 covers the fastener in the countersunk hole 54 from electrical current. FIG. 11B also shows a stud guide anchor hole 47 on the stud guide 46. The stud guide anchor hole 47 on the stud guide 46 would be useful in re-work (old work) applications, when the stud guide 46 is flush with a support structure wall in lieu of engaging rotating flags.

Figure 12:
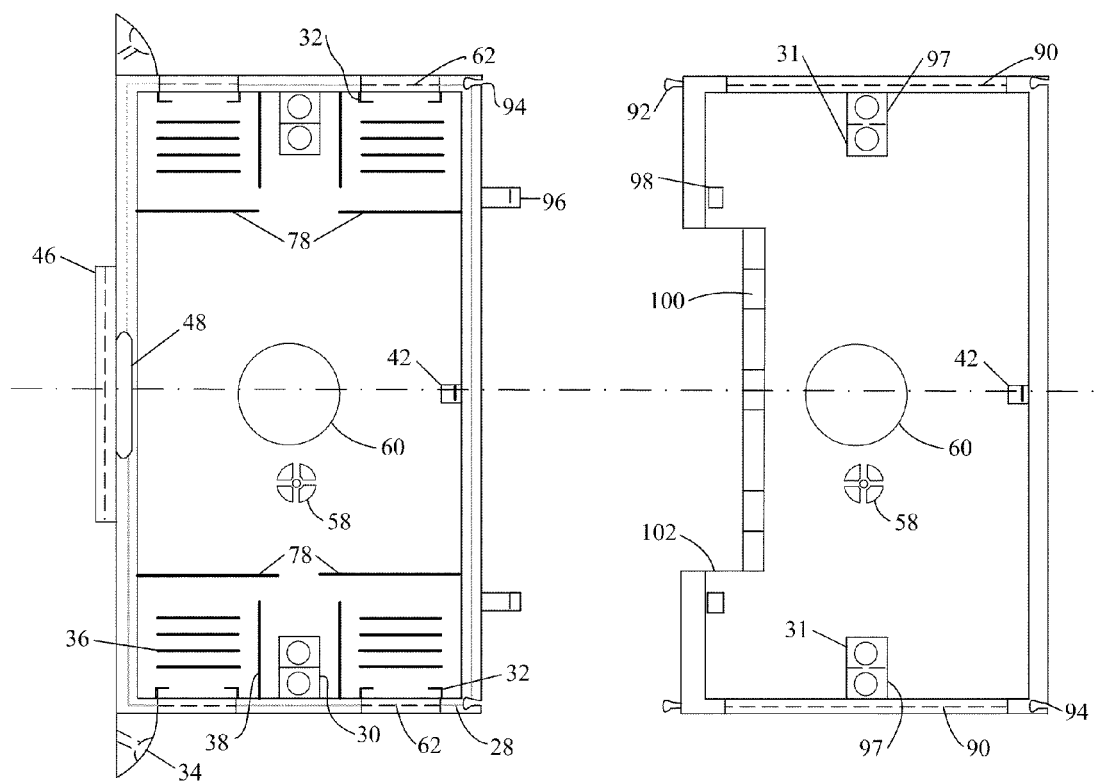
FIG. 12 is a front elevation adjacent view of a female section flush mount electrical box and a one piece section ganged low voltage box.
Figure 12A:
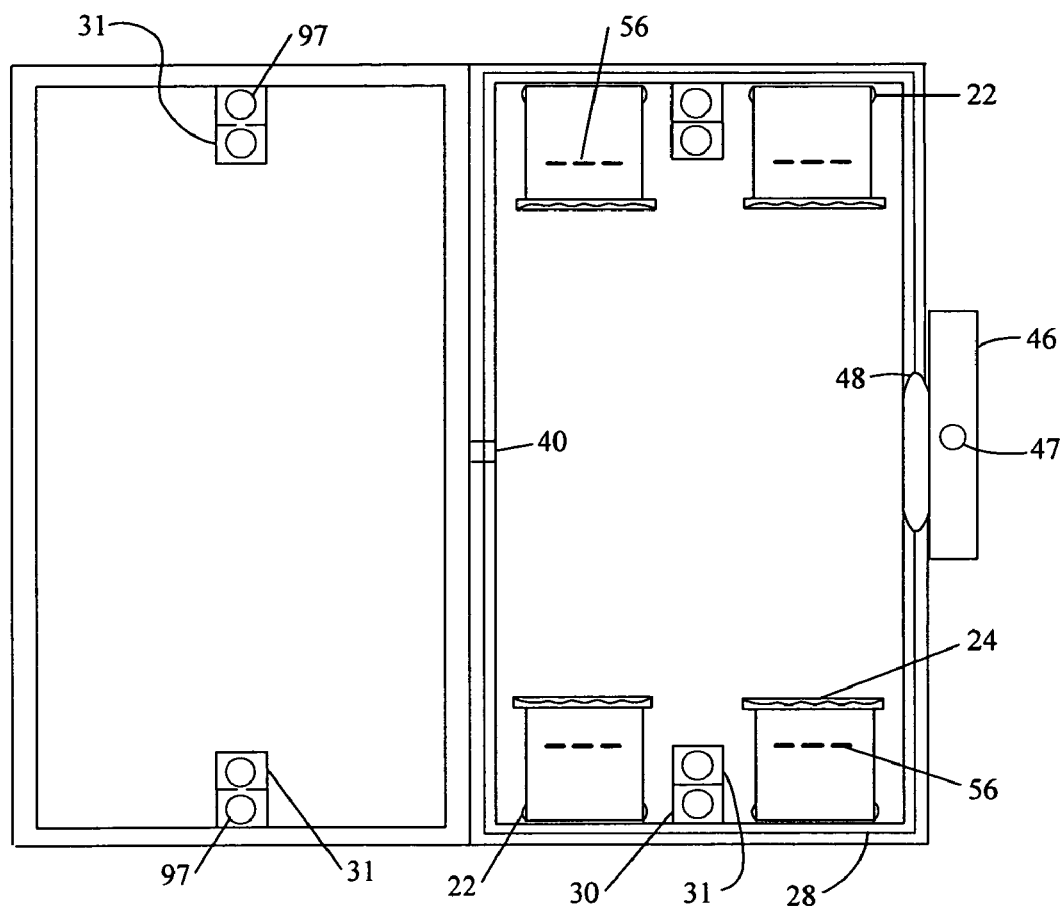
FIG. 12A is a front elevation view of a female section flush mount electrical box with an integral low voltage box.
Figure 13:
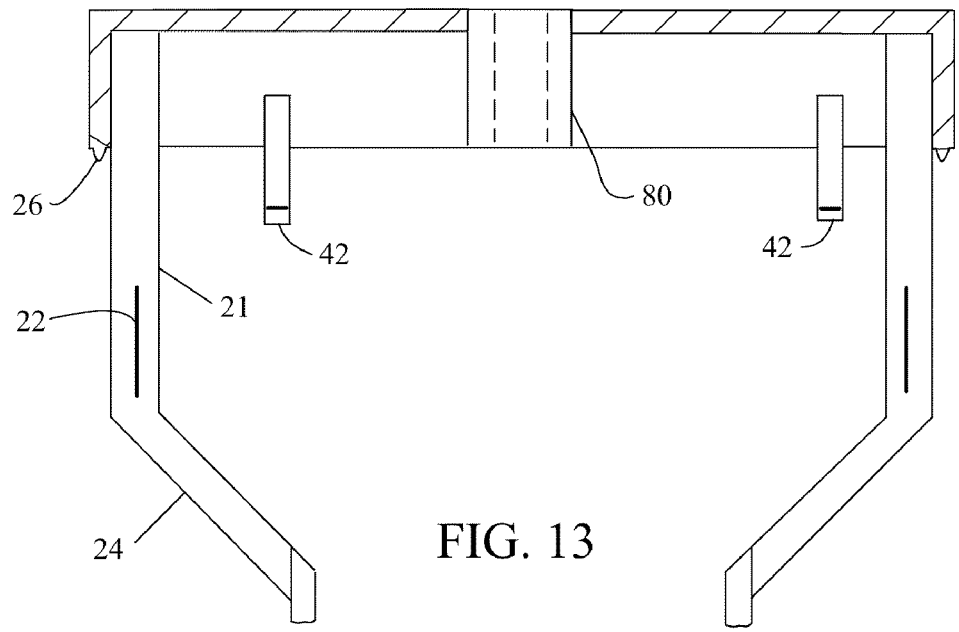
FIG. 13 is a cross sectional side elevation view of a male section ceiling fan flush mount electrical box taken along line 13-13 of FIG. 13A.
Figure 13A:
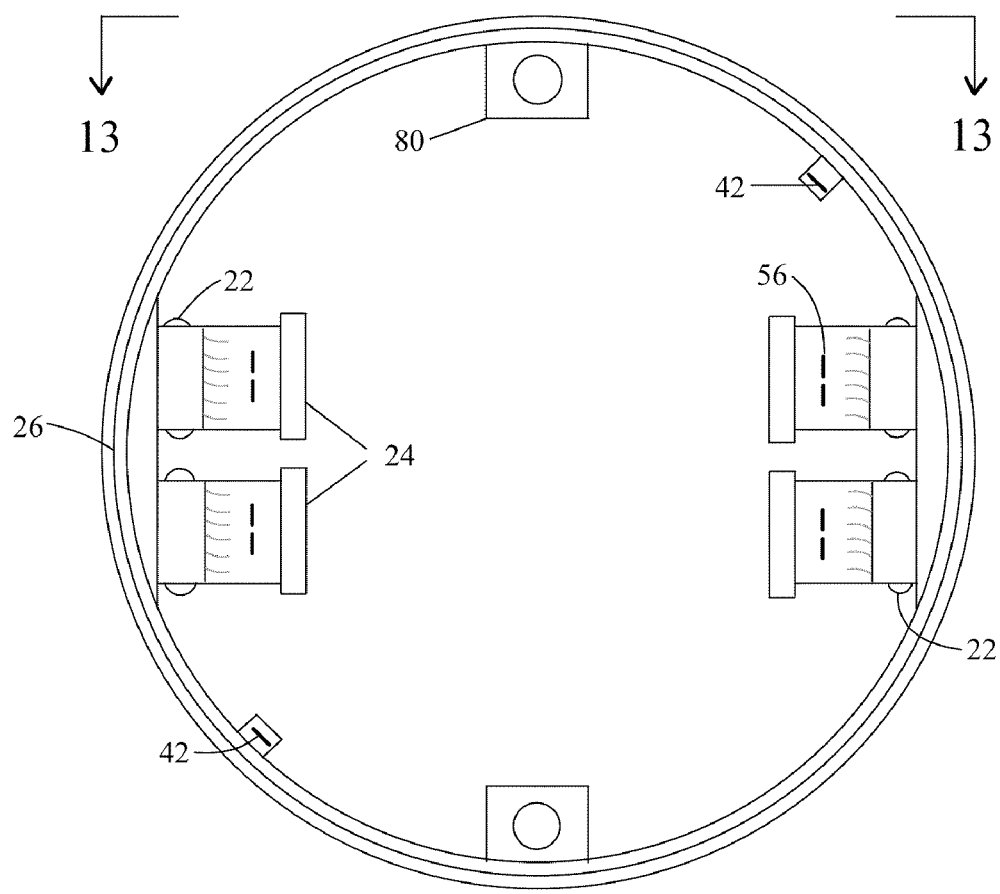
FIG. 13A is a inverted plan view of a male section ceiling fan flush mount electrical box.
Figure 14:
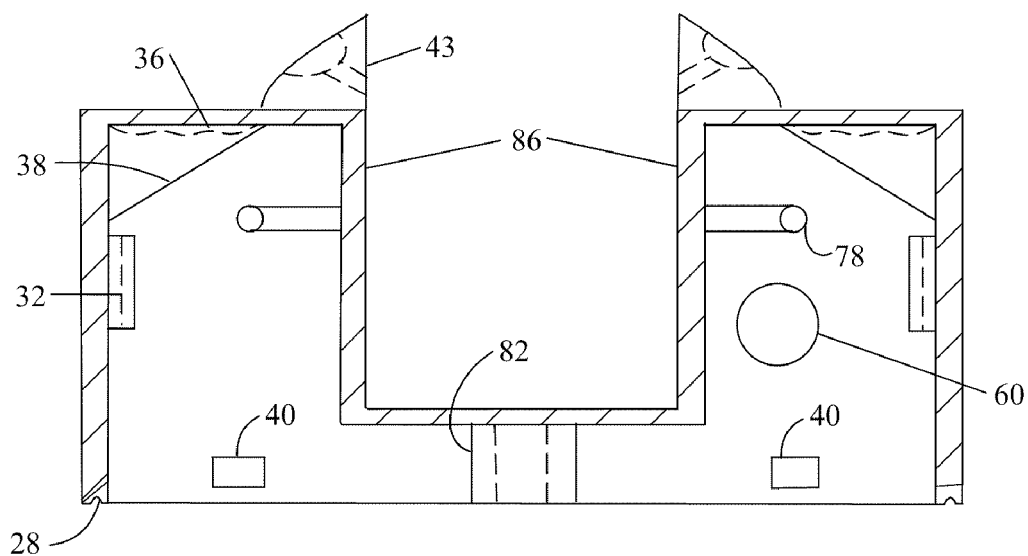
FIG. 14 is a cross sectional side elevation view of a female section ceiling fan flush mount electrical box taken along line 14-14 of FIG. 14A.
Figure 14A:
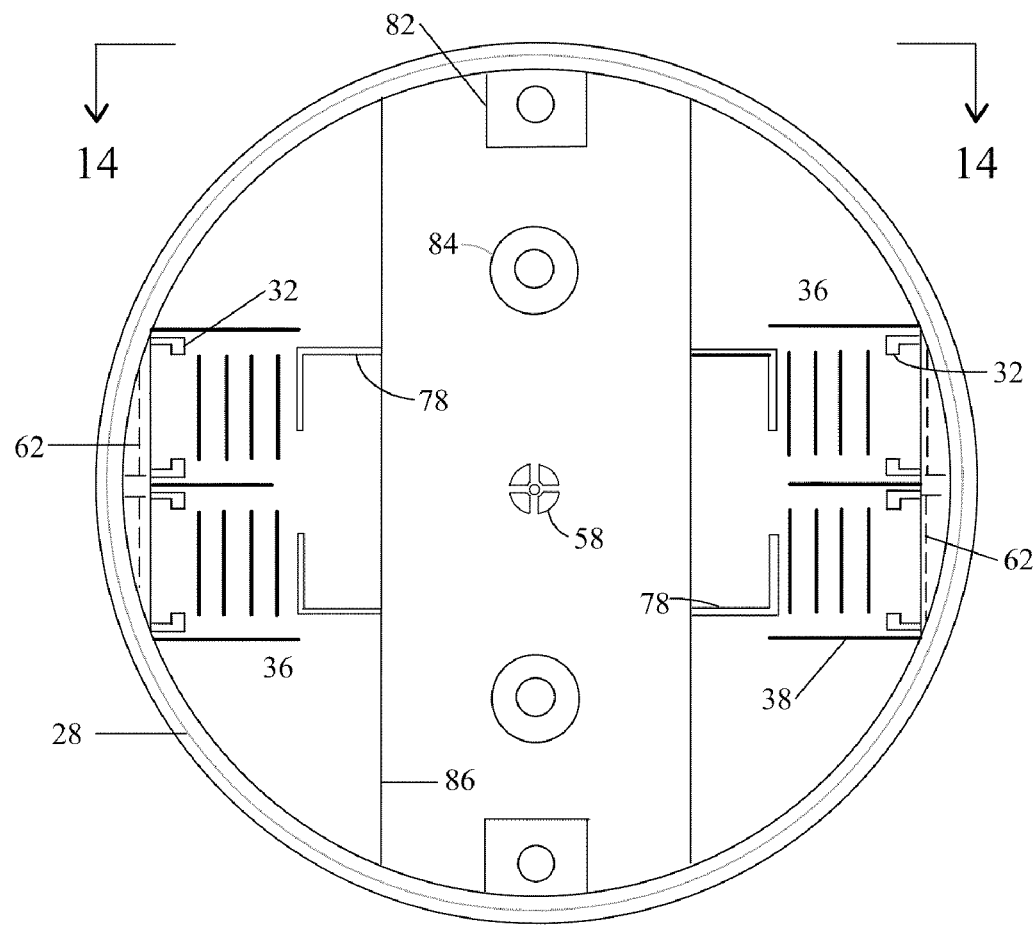
FIG. 14A is a inverted plan view of a female section ceiling fan flush mount electrical box.

Moving on, a flush mount gangable electrical box is illustrated in FIG. 12. In this instance, a one piece low voltage box with gang boss 92 slides on the gang channel 94 of the female section. A back wall gang snap 96 aligns the side-by-side sections. The top and bottom walls have a low voltage port 90 and a back wall low voltage port 102. The wall port 102 has a low voltage wire harness 100. A threaded short yoke boss 97 is flush with the front of the low voltage box, a anchor boss 31 is also shown. FIG. 12A shows a low voltage box portion integral with the female section box. A round flush mount sectional ceiling fan box is detailed in FIGS. 13, 13A, 14 and 14A. Below a stud or ceiling joist cavity 86 is a ceiling yoke post 82 which aligns with a ceiling yoke boss 80 on the male section. Conductor feeds through the side walls of cable ports 62 and hang from cable hangers 78. A reinforced washer hole 84 allows a fastener to anchor the section to the support structure.

Figure 15:
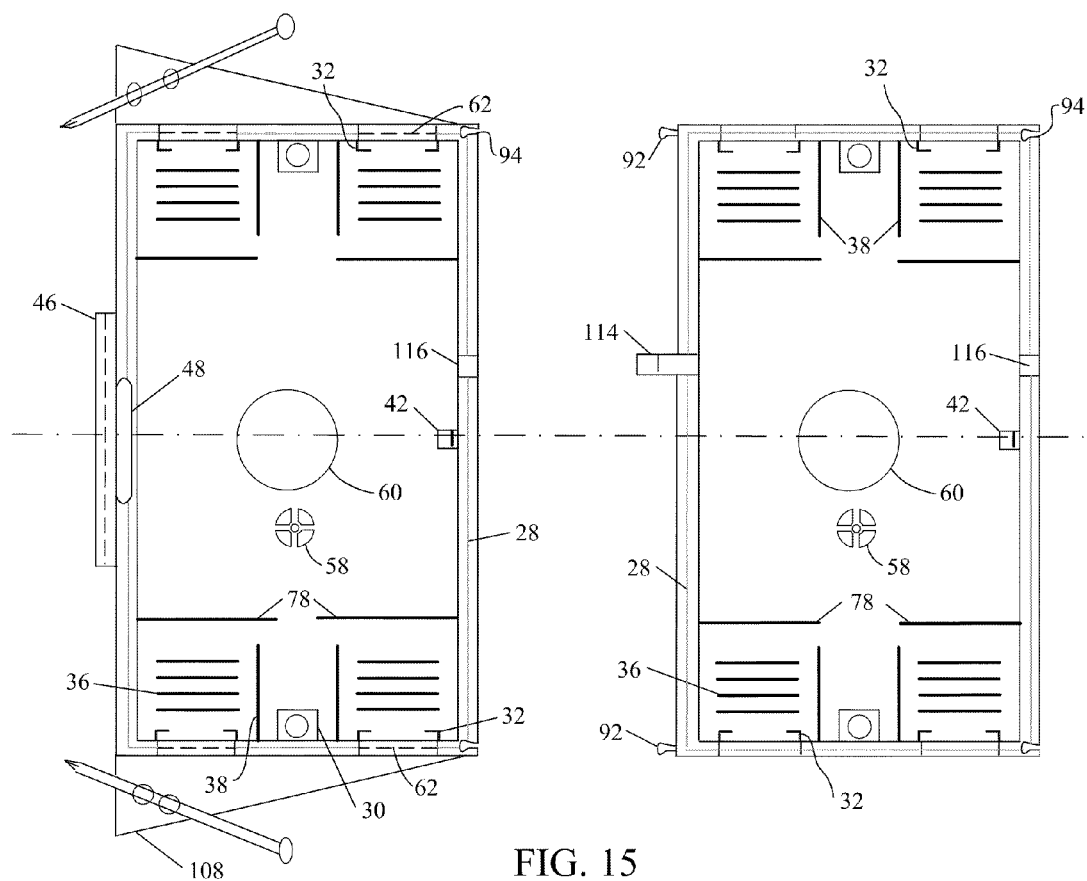
FIG. 15 is a front elevation adjacent view of a female section flush mount ganged electrical box.
Figure 16:
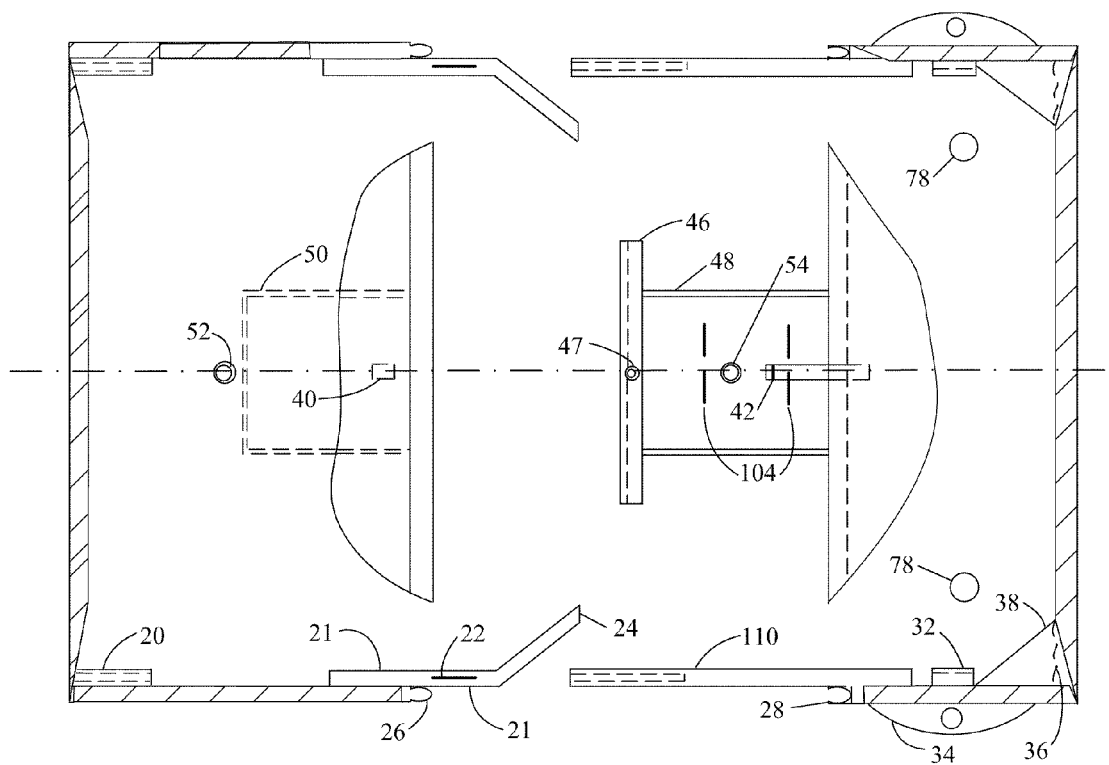
FIG. 16 is a side elevation cross sectional adjacent view of a flush mount extended electrical box.
Figure 17:
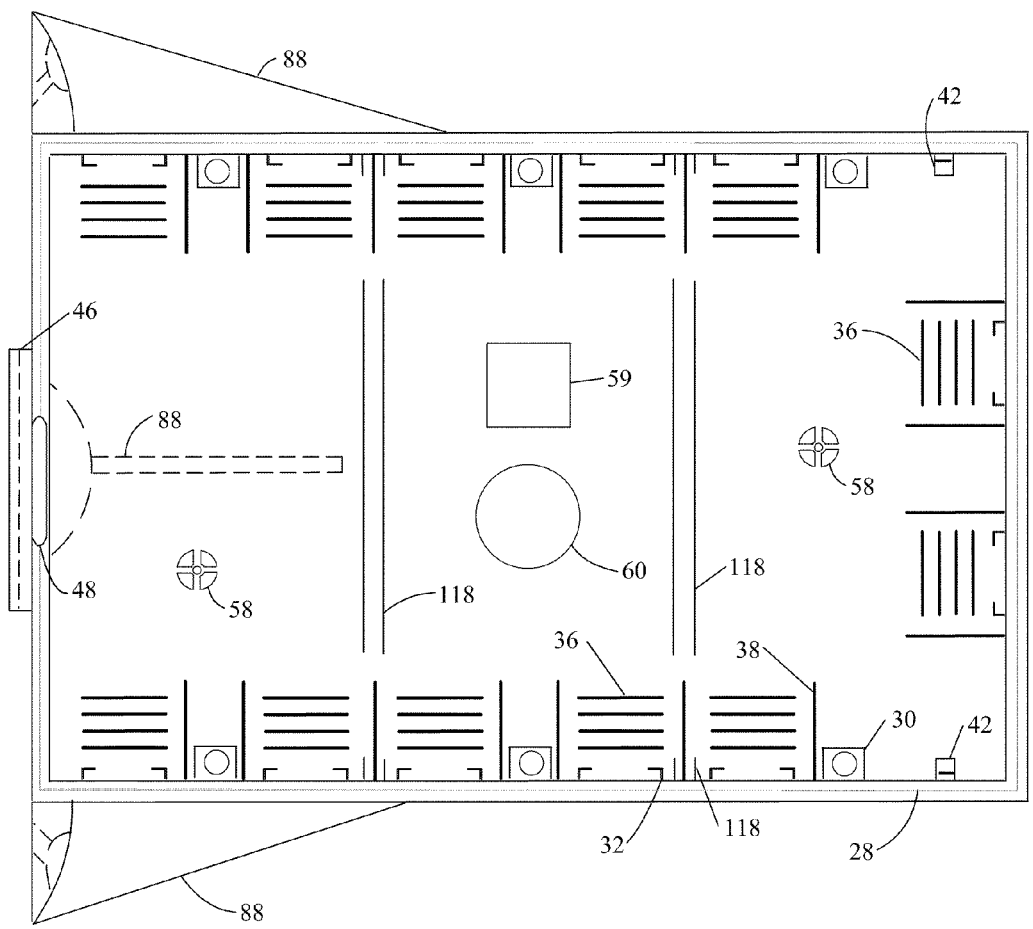
FIG. 17 is a top plan view of a female section flush floor/wall mount electrical box.
Figure 18:
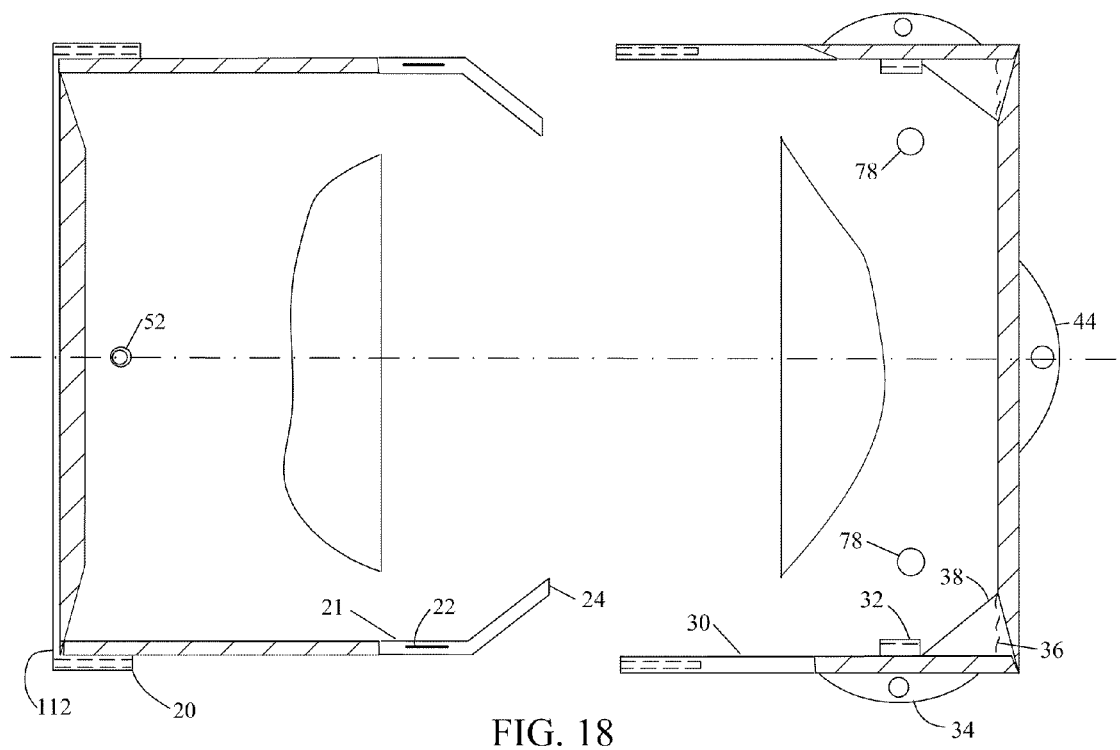
FIG. 18 is a side elevation cross sectional adjacent view of a flush mount electrical box with the front section fitting inside the rear section.
Figure 18A:
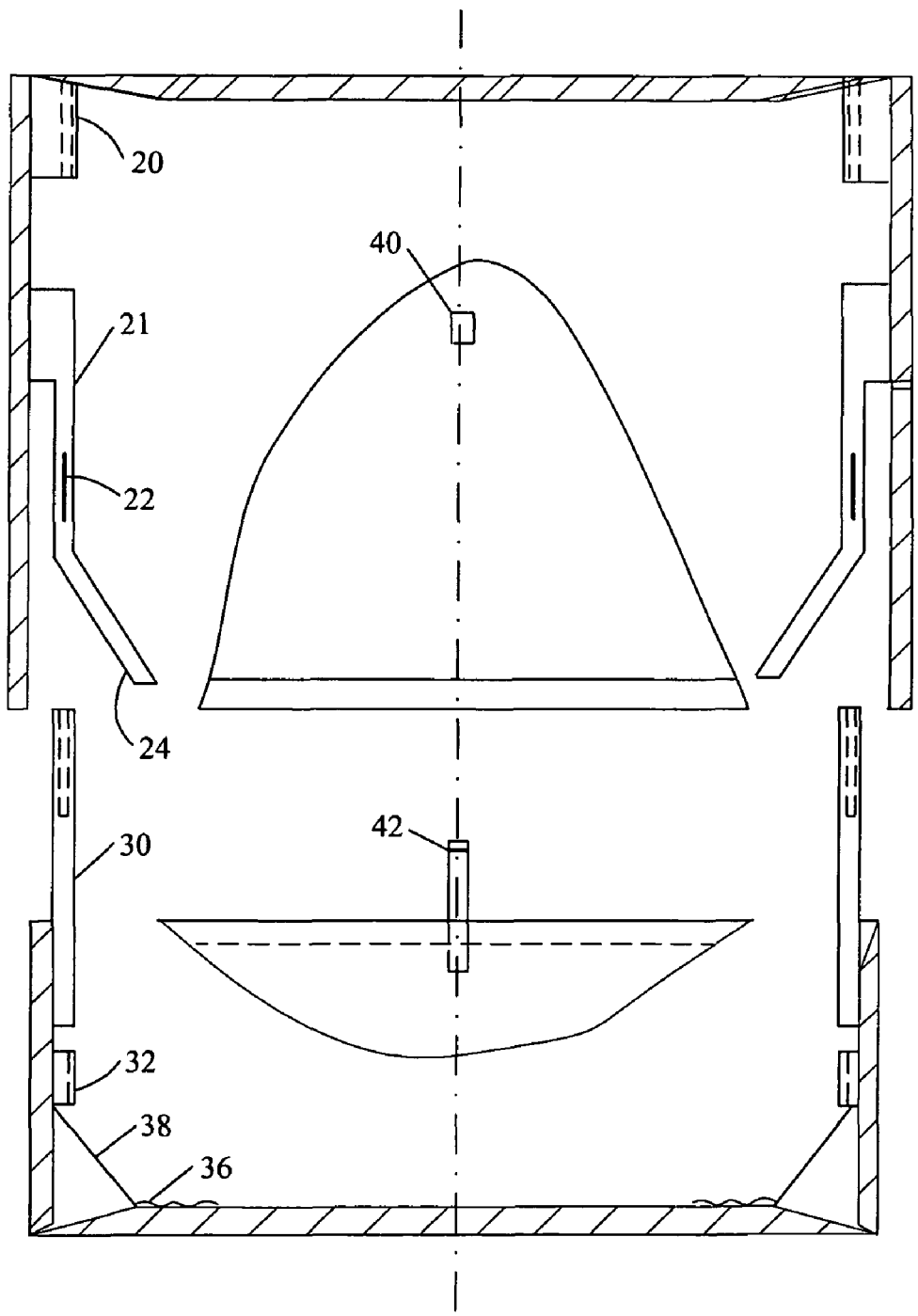
FIG. 18A is a side elevation cross sectional adjacent view of a surface mount electrical box with the base fitting inside the front section.
Figure 19:
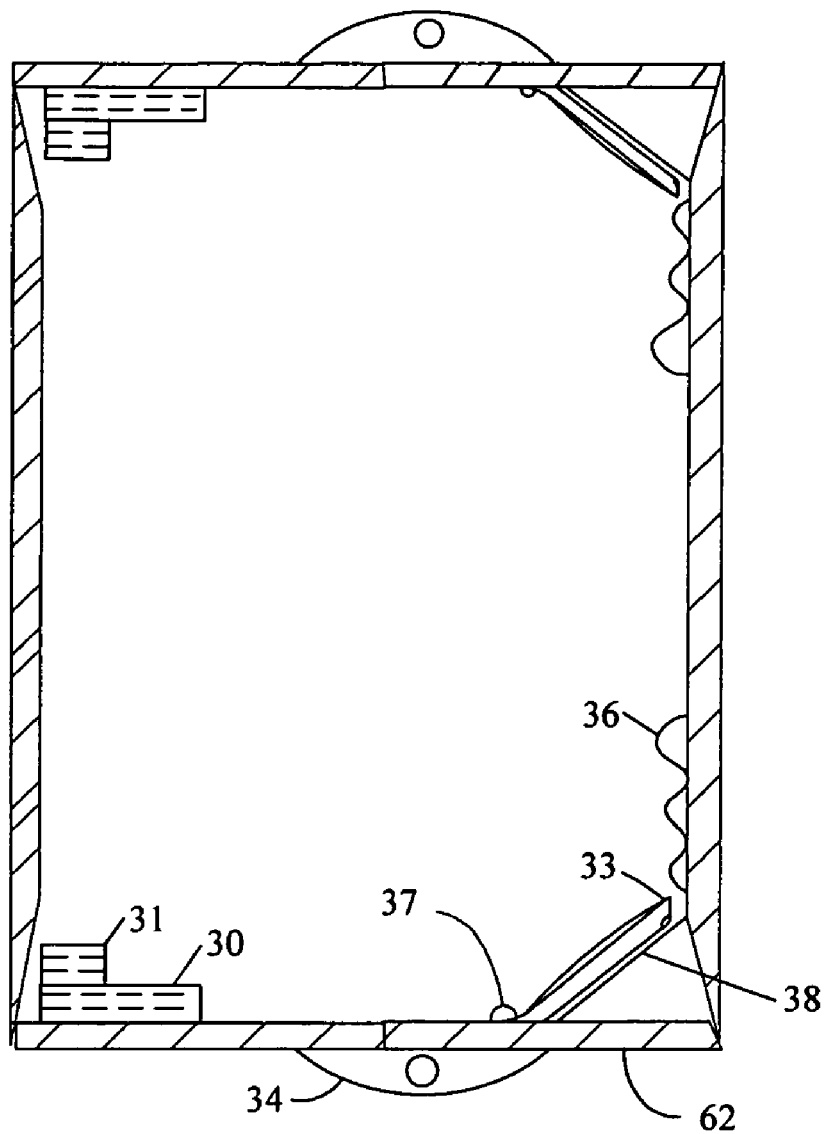
FIG. 19 is a side elevation cross sectional adjacent view of a one-piece flush mount electrical box with the ramp in front of the wall clamp.
Figure 19J:
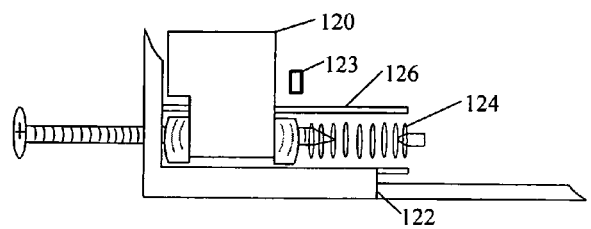
Figure 19A:
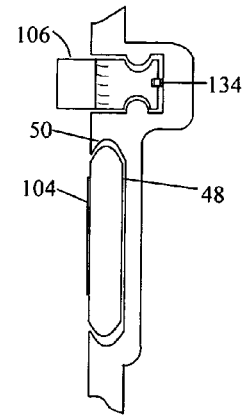
Figure 19B:
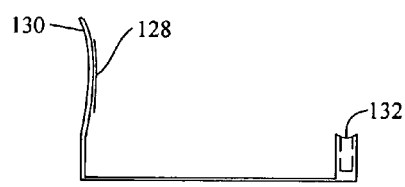
Figure 19C:
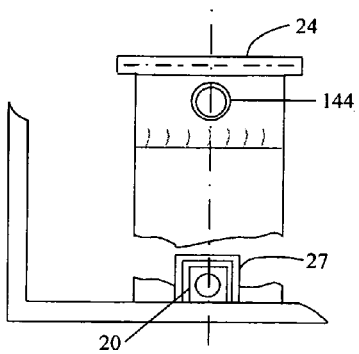
Figure 19D:
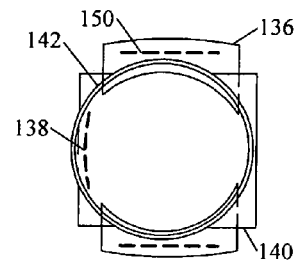
Figure 19E:
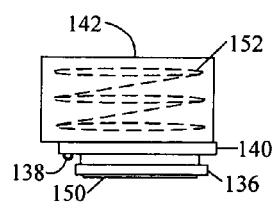
Figure 19G:
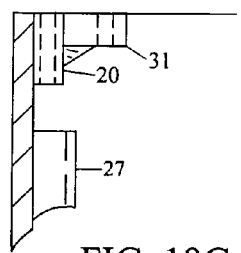
Figure 19H:
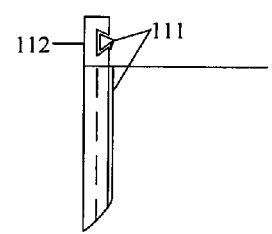
Figure 19F:
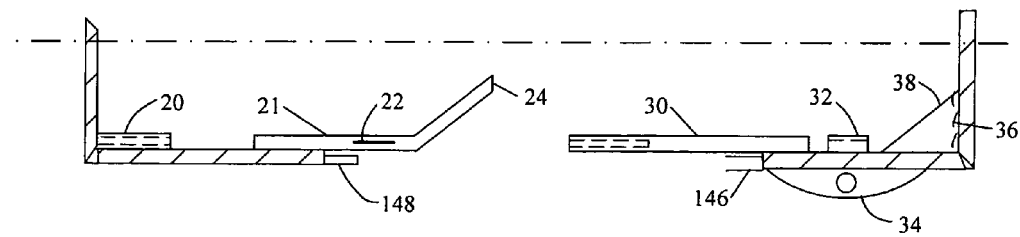

Similar to FIG. 12, FIG. 15 relates to a ganged female portion electrical box sections. A sway clip 114 fitted into a sway notch 116 hold the sections in place. The back gang snap 96, gang recess 98 in FIG. 12 can be added. A gang box gusset anchor flange 108 extends the width of the box for additional assemblies support. The on-center of the ganged yoke boss 20 and yoke post 30 positioned for standard cover plate attachment. In FIG. 16, an extended yoke post 110 and extended male section portion accommodates thicker wall structure flush mount applications. The stud guide 46 can be scored and broken off. Turning now to FIG. 17, a gusset anchor flange 88 can attach the box section to a floor joist or wall stud. When the male box section has a periphery flange with anchor holes (not shown) and installed in the floor, the gusset anchor flanges 88 would be optional. The female box section also has a partition ribs 118 for a voltage partition (not shown) to be inserted in the box separating high and low voltage conductor. FIG. 18 shows a sectional electrical box with the front section fitting into the base. The yoke post 30 is parallel with the base section top and bottom enclosure walls and the yoke boss 20 is outside the front section top and bottom enclosure walls. In FIG. 18A a surface mounted box is shown where the front section fits outside the base. The yoke post 30 is inside the base and the yoke boss 20 inside the front section. The front section can have a yoke post raceway 27 (see FIG. 11A). FIG. 19 shows an electrical box constructed as a complete assembly with the ramp 36 base perpendicular to a wall clamp 33. The wall clamp 33 is reinforced at an enclosure wall with a stress bead 37 which functions as a hinge. There is a gap between the tip of the wall clamp 33 and the ramp 36 for ease of feeding conductor thru the cable port 62. On a ceiling box, the anchor boss 31 should be the length of the yoke post 30 eliminating in some cases the need for a fixture mounting bracket. An anchor flange 34 attaches the electrical box to a support structure.

In general, the sectional flush mount and surface mount electrical box assemblies have cable clamping members and yoke boss on the front section with a yoke post and cable port on the rear section. The electrical box sections securely connected with yoke screws. The snap tabs reinforced sufficiently to meet or exceed Underwriter Laboratory standards. Extra load ceiling yoke post and ceiling yoke boss appropriate when installing heavy ceiling fixtures. The cable clamp arrangements allow the ease of feeding wire into the electrical box. The cable clamp, retaining walls plug the cable port opening in the absence of conductor. In the event, wire needs to be added or removed, the sections can be dissembled then reassembled. The sections can be constructed then fused into one section and the mounting bracket and mounting bracket guide configurations would be unnecessary. The electrical box constructed as a complete assembly. On the flush mount electrical box, the mounting bracket slides into a cavity covering exposed metal fasteners. A manufacture could instruct that exposed metal fasteners on non-metallic electrical box can be covered with electrical tape, trumping the National Electrical Code (NEC) regarding exposed metal fasteners. Though NEC's reasoning on non-metallic electrical boxes concerning exposed metallic fasteners is sound because current of the hot wire touching the exposed screw sparks, and might not trip the circuit breaker. Clamping members on the side walls of the surface mount electrical box assembly would allow for multiple devices in the electrical box to meet electrical code requirements. Clamping members and molding tabs cover metal fasteners on the surface mount electrical box. With ceiling joist bracing and high tensile fasteners, the ceiling fan electrical box assembly can withstand the substantial weight of a ceiling fan. A surface mount ceiling electrical box, with an installed fixture not exceeding six pounds, in the realm.

Accordingly, the preferred embodiments of the sectional electrical box assemblies, in the descriptions shown and described in detail, it becomes readily apparent to those skilled in the art that alterations and modifications made, without departing from the embodiments appended claims.

The invention claimed is:

1. An electrical box comprising: a male section with a periphery male interlock on an open end wall having an open front wall, a top wall, a bottom wall, and a pair of opposing sidewalls; a female section with a periphery female interlock on said open front wall having a top wall, a bottom wall, a pair of opposing sidewalls and a back wall; the male section consist of a yoke boss, a clamp arm with an integral clamp member, and a mounting bracket guide; whereas the female section consist a yoke post, a clamp guide, a ramp, a retaining wall, a mounting bracket, and an anchor flange; further comprising the mounting bracket sliding into the mounting bracket guide and the clamp arm sliding into the clamp guide form an assembly; said box and said walls can be round configurations.

2. The electrical box according to claim 1, wherein the clamp member bias toward the ramp securing conductors; further comprising the clamp member and the retaining wall form a closure of a cable port; the port perpendicular to the ramp; further including the retaining wall integrally connected to the yoke post; the yoke post slides into a yoke raceway on the male section.

3. The electrical box according to a claim 1, wherein mechanical fasteners secure the yoke boss and the yoke post; the clamp arm an elongated cutout when aligning with the yoke post; further comprising a snap tab engages a snap recess to connect the male section and the female section; an anchor boss integrally connected to the yoke boss.

4. The electrical box according to claim 1, wherein the male section and the female section fabricated then fused together; further including the electrical box fabricated as a complete assembly.

5. An electrical box comprising: a surface mount box with a front section an open front wall having a top wall, a bottom wall, a pair of opposing sidewalls, and an open end wall; a base section having said open front wall, a top wall, a bottom wall, a pair of opposing sidewalls, and a back wall; the front section consist of a yoke boss, a clamp arm with an integral clamp member, and a snap recess; whereas the base section consist a yoke post, a snap tab, a clamp guide, a ramp, and a retaining wall; the clamp member bias toward the ramp; said yoke boss interlock with said yoke post and the front section fitting outside the base section to form an assembly; said box and said walls can be round configurations.

6. The electrical box according to claim 5, wherein the front section clamp aligning with the base section the clamp guide, the ramp, the retaining wall, and a cable port; further including mechanical fasteners secure the yoke boss and the yoke post; the clamp arm an elongated cutout when aligning with the yoke post; the yoke post slides into a yoke raceway on the front section.

7. The electrical box according to claim 5, wherein the front section periphery male interlock on the open end wall; the base section periphery female interlock the open front wall form the assembly.

8. The electrical box according to claim 5, wherein the surface mount box configurations abuts encapsulating molding; a molding base with a female interlock, a molding cover with spread side walls having male interlock legs manually squeezed into the female interlock on the molding base engages the molding cover; the molding base receives a molding tab and a wire hanger insert; further including the wire hanger continuous combination raceway.

9. the electrical box according to claim 5, wherein the front section and the base section fabricated then fused together; further including the electrical box fabricated as a complete assembly.

* * * * *